United States Patent [19]

Narato et al.

[11] 4,364,032
[45] Dec. 14, 1982

[54] METHOD AND APPARATUS FOR DIAGNOSING LOCAL OVERHEATING IN A ROTARY ELECTRIC MACHINE

[75] Inventors: Kiyoshi Narato, Ibaraki; Keizou Ohtsuka; Sadahiko Niwa, both of Hitachi, all of Japan

[73] Assignee: Hitachi, Ltd., Tokyo, Japan

[21] Appl. No.: 213,094

[22] Filed: Dec. 4, 1980

[30] Foreign Application Priority Data

Dec. 8, 1979 [JP] Japan ................................ 54-158730

[51] Int. Cl.³ ............................................ G08B 17/12
[52] U.S. Cl. ........................................ 340/679; 73/28; 324/71 CP; 340/584; 340/647; 436/7
[58] Field of Search ............... 340/679, 647, 627, 584, 340/588; 73/339 R, 28; 324/71 CP

[56] References Cited

U.S. PATENT DOCUMENTS

| | | | |
|---|---|---|---|
| 3,427,880 | 2/1969 | Grobel et al. | 73/339 R |
| 3,702,561 | 11/1972 | Carson et al. | 73/339 R |
| 3,775,763 | 11/1973 | Couch et al. | 340/627 |
| 4,074,137 | 2/1978 | Carson et al. | 73/339 R |
| 4,121,458 | 10/1978 | Fort | 73/339 R |
| 4,160,908 | 7/1979 | Phillips | 73/339 R |

Primary Examiner—Glen R. Swann, III
Attorney, Agent, or Firm—Antonelli, Terry & Wands

[57] ABSTRACT

In a gas cooled rotary electric machine using insulating coating material which is subjected to thermal-decomposition when the insulating coating material is exposed to high temperatures thereby generating submicron particles, the concentration in the cooling gas of submicron particles generated through thermal-decomposition of the insulating coating material and distributed in the cooling gas is detected and an alarm signal is issued when the time-integration of a signal representing the concentration of the submicron particles exceeds a predetermined reference integration value.

6 Claims, 7 Drawing Figures

METHOD AND APPARATUS FOR DIAGNOSING LOCAL OVERHEATING IN A ROTARY ELECTRIC MACHINE

BACKGROUND OF THE INVENTION

This invention relates to a local overheating diagnosis method and apparatus for a rotary electric machine, and more particularly to a diagnostic method and apparatus for local overheating occurring in the coil, core, or the like of a rotary electric machine such as a gas cooled turbo-generator through diagnosis of the concentration in cooling gas of submicron particles generated from varnish coated on the surface of the relevant overheated portion.

As the capacity of each unit of a turbo-generator increases, the deterioration of the insulation coating of the generator may invite a dangerous failure, and especially a high possibility of causing a burning failure around the core or coil of the generator. There have been proposed a number of diagnosis systems for detecting local overheating thereby to prevent a burning failure by detecting submicron particles generated from varnish insulator coated on the surface of the coils or cores and estimating the degree of the temperature rise of the relevant place.

One example of such a prior system is U.S. Pat. No. 3,427,880 issued Feb. 18, 1969 to Lloyd P. Grobal et al, entitled "Overheating detector for gas cooled electric machine". According to this patent, the local overheating diagnosis is based on the fact that when the insulation material coated on the surface of overheated coils or cores is decomposed by overheating, submicron particles having a diameter ranging from 0.001 to 1 micron are generated. These particles are diffused and float into a cooling gas circulated for cooling the coils and cores such as hydrogen, especially in a large size generator. A part of this cooling gas is extracted to the outside of the gas cooled electric machine and the overheating is detected by measuring the degree of concentration of the submicron particles contained in the cooling gas. An ion chamber particle detector is used for detecting the submicron particles. This detector is provided with an ionizing section including a source of radioactive rays and a detector section having an electric source so that the cooling gas is ionized to produce ion pairs which are generally detected as an ion current in the detector section. When the cooling gas contains submicron particles, the ion pairs are attached to the particles thereby reducing the ion current so that the concentration of the submicron particles is detected from a reduction of the ion current. An improved method of processing signals obtained by using a similar detector is disclosed in Japanese patent application No. 53-92689, which was filed July 31, 1978 by Fred Hiroshi Sawada et al as claiming the convention priority on the basis of U.S. patent application Ser. No. 820,608 filed by Fred Hiroshi Sawada et al Aug. 1, 1977 and which was published as Japanese patent laid-open No. 54-44740 on Apr. 9, 1979.

The overheating diagnostic apparatuses as disclosed by the aforementioned U.S. patent and Japanese patent application are generally useful for preventing a burning failure of the core and/or coil of a turbo-generator. However, it should be noted that these prior-art local overheating diagnostic apparatuses perform the diagnosis of local overheating through comparison of an actual value measured by the detector with an overheating reference value predetermined in terms of the magnitude of the output signal from the detector for determining whether an abnormal condition takes place inside the generator.

The inventors of this invention carried out various experimental studies on these local overheating diagnostic apparatuses to find an approach to more effective diagnosis and found that the aforementioned conventional manner of determining the overheating reference value and that of diagnosis do not necessarily achieve correct diagnosis. In other words, the magnitude of the output signal produced by the detector when dangerous local overheating takes place depends on not only the size of the rotary electric machine but on the developing condition of the overheating. Therefore, diagnosis only through the magnitude of the output signal from the detector is liable to result in misjudgement on the local overheating.

SUMMARY OF THE INVENTION

An object of the present invention is to provide a highly reliable local-overheating diagnostic method and apparatus which can eliminate the drawbacks of the prior-art as mentioned above.

According to one aspect of the present invention, the above object is achieved by a method which comprises the steps of detecting the concentration in cooling gas of submicron particles generated when the insulating material used in a rotary electric machine is decomposed by overheating which particles are then distributed in the cooling gas for the machine. Following this, steps are taken for detecting the change of the concentration exceeding a predetermined value, integrating the concentration with respect to time from the time at which the change of the concentration is detected, and judging that the local heating in the rotary electric machine is in critical condition when the integral value reaches a predetermined integration reference value.

According to another aspect of the present invention an apparatus for carrying out the above method is arranged to include a detector for detecting the concentration in cooling gas of submicron particles generated by thermal-decomposition of the insulating material of the rotary electric machine and distributed in the cooling gas for the rotary machine, an integrator adapted to integrate the detected concentration with respect to time, a concentration displacement detector for detecting the displacement of said detected concentration exceeds a predetermined value, controlling means for causing the integrator to start its operation in response to the generation of a detecting signal by said concentration displacement detector, and to terminate its operation and clear its contents when the detecting signal by said concentration displacement detector disappears, and means for producing an alarm signal when the integration by said integrator reaches a predetermined integration reference value.

The above objects, effects and advantages will be understood from the following detailed description of preferred embodiments of the invention with reference to the accompanying drawings.

DESCRIPTION OF THE PREFERRED EMBODIMENTS

Figure 1:
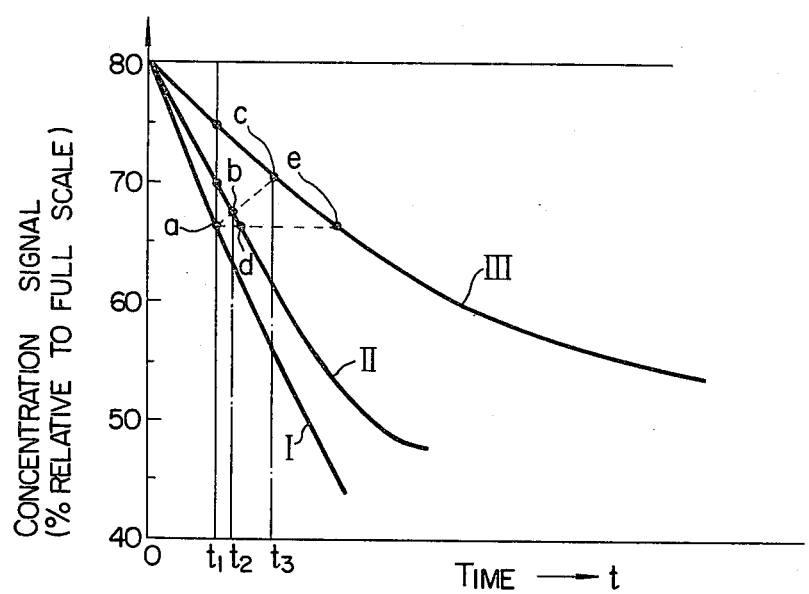
FIG. 1 illustrates a graphical representation of characteristic curves showing the relationships between the overheating duration time and a reduction of the monitoring signal in various different conditions in progress of overheating.

The developing state of local overheating occurring in such rotary electric machines as turbo-generators takes different patterns depending on the capacity of rotary electric machine and/or on the cause of overheating such as rapid developing state, slow developing state, much slower developing state, or the like. The possibility of dangerous burning failure is different depending on the pattern of local overheating even with the same concentration of submicron particles of the insulating material contained in the cooling gas for the generator. The above phenomena will be further explained with reference to FIG. 1. FIG. 1 shows three different patterns in variation of the concentration signal representing the concentration of submicron particles over a perior of time. As will be described in detail hereinafter, the concentration signals shown in FIG. 1 represent the ratio in percent of the output current of the ion chamber particle detector to the full scale thereof, the concentration increases as the percentage decreases, or the difference between the output current and the full scale value indicates the degree of concentration. As shown in FIG. 1, curve I provides a pattern for a rapid developing state of local overheating, curve II for a slow developing state, and curve III for a much slower developing state. On these three developing patterns of curves I, II and III, the points a, d and e are at the same magnitude of concentration signal outputted from the detector. However, the total quantity of submicron particles generated by thermal-decomposition of the insulating material up to the point e on curve III is greater than that accumulated up to the point d, which is in turn larger than that accumulated up to the point a. Therefore, the degree of the developing state of overheating is the greatest, i.e. the most dangerous state, at the point e on curve III rather than at any of the other points.

In the pattern of curve I, the total quantity of submicron particles generated during a time interval t after occurrence of local overheating corresponds to an integration of the concentration signal from $t_0$ to $t_1$. The same total quantity of submicron particles is reached in curve II after a lapse of time $t_2$, i.e. at point b and in curve III after a lapse of time $t_3$, i.e. at point c. Accordingly, the degree of the overheating developing state is the same at these points a, b and c.

Thus, since many different overheating developing states are possible, the way of figuring out the degree of overheating developing state by integrating the concentration signal with respect to time is better for correct diagnosis of overheating. If, as in the conventional way, the control reference is determined simply by the magnitude of the concentration signal and the diagnosis of overheating is based on the control reference, it will be possible that the developing state of overheating cannot be found without delay, resulting in misjudging of local overheating.

Figure 2:
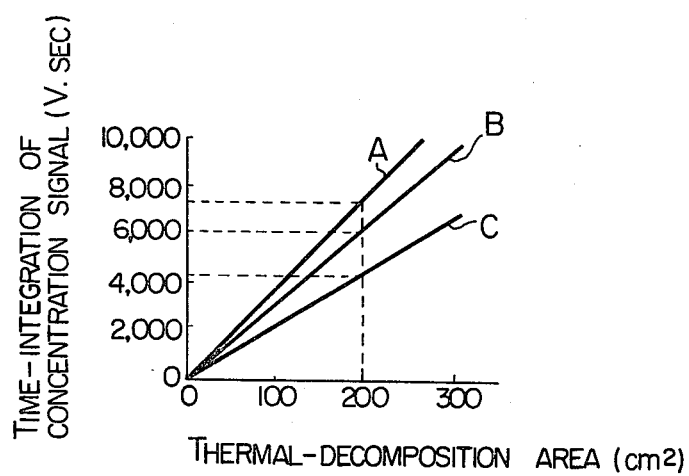
FIG. 2 illustrates a graphical representation of characteristic curves each showing the relationship between the decomposed area of the insulating coating and an integration of the monitoring signal for different machine types.

FIG. 2 shows the relationship between the thermal-decomposition area in the insulating material and an integration of the concentration signal for each of various different types of generators. This has been made up by choosing three different types of generator having a volume of 100 m$^3$ (line A), 85 m$^3$ (line B), and 60 m$^3$ (line C), respectively, provided for circulation of cooling gas, and carrying out an overheating test on each of these three machines to measure the integration of the concentration signal while varying the thermal-decomposition area.

As seen from the curves in FIG. 2, the value of integration of the concentration signal is different from machine to machine or depending on the volume of the space for circulating the cooling gas, even though the area of insulating material subjected to thermal-decomposition is the same and hence the overheating develops up to the same degree. For example, assuming that an abnormal condition may occur when thermal-decomposition develops over an area of insulating material as large as 200 cm$^2$, such abnormal condition is expected when the time-integration of the concentration signal reaches about 7000 V. sec for the machine represented by curve A, about 6000 V. sec for that by curve B, and about 4200 V. sec for that by curve C. Thus the integration of the concentration signal differs depending on the size of machine even with the same degree of the overheating developing state.

In short, under the condition that overheating develops to cause an abnormal state in the machine, the magnitude of the concentration signal is different depending on not only the type of machine, but also the pattern in developing of the overheating as shown in FIG. 1, while the integration of the concentration signal still differs depending on the type of machine, but is substantially independent of the pattern in developing of the overheating. According to the present invention, the thermal-decomposition area of insulating material due to overheating is judged by time-integration of the concentration signal starting upon occurrence of thermal-decomposition, and when the integrated value reaches a predetermined reference integral value which is selected depending on the type of machine, it is judged that the machine is subjected to excess overheating to cause a dangerous state.

Figure 3:
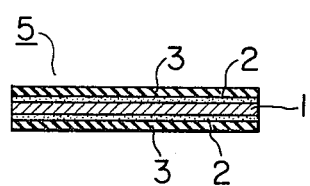
FIG. 3 is an enlarged sectional view of a resistor element used in the invention.
Figure 4:
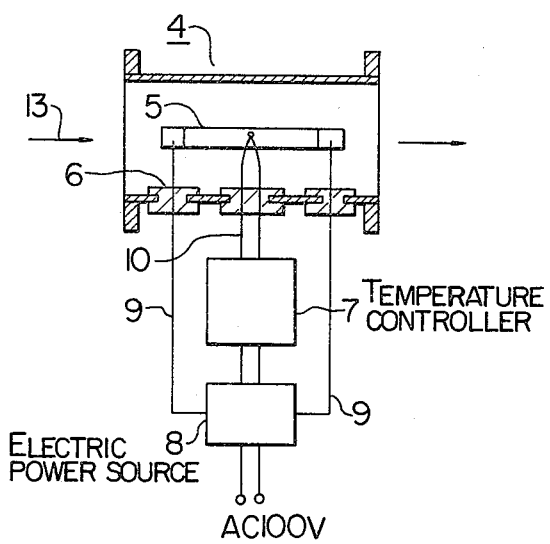
FIG. 4 shows a construction of a pyrolytic furnace employing the resistor of FIG. 3.

Next, a method of setting out this reference value will be described. FIG. 3 and FIG. 4 show a pyrolytic furnace for setting out the overheating reference integral value in the local overheating diagnostic apparatus and a test piece for this purpose, respectively. Test piece 5 is formed of a base 1 made of a silicon steel plate and a film 2 made of inorganic material the same as the antioxidant material used in a turbo-generator and coated as thick as 0.1 to 0.5 mm on both the upper surface and the lower surface thereof. On film 2 is further coated an insulating coating 3 of a predetermined uniform thickness and made of the same material as used in the turbo-generator. Such test pieces 5 are made with different coating areas. The insulating material used in an actual rotary machine includes phenolic resin such as phenol-formaldehyde polymer, which generates submicron particles due to thermal-decomposition around 390° C. Other insulating materials used for this purpose are Alkyd resins, epoxy resins, or the like. The coating thickness varies from 0.1 to 0.3 mm, for example, depending upon the type of machine to be coated and the kind of insulating material used. The test piece 5 is made to simulate the actual coating state in the machine to be tested.

Test piece 5 is disposed in the center of the hollow of the furnace and the opposite ends of the test piece are connected to electric power source 8 through lead wires 9 as shown in FIG. 4. The power supplied from power source 8 to test piece 5 is controlled by temperature controller 7 so that the test piece 5 is heated at a temperature where thermal-decomposition develops on the coated resin, and thus the test piece 5 generates submicron particles inside the pyrolytic furnace 4 due to thermal-decomposition of insulating material 3 thereof, where the members 6 and 10 are a bushing and a thermostat, respectively.

Figure 5:
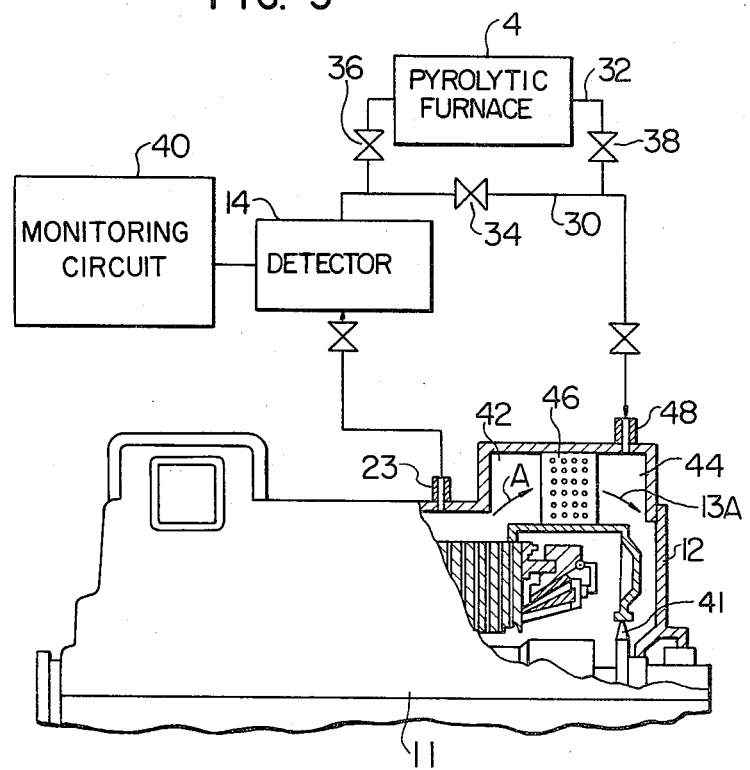
FIG. 5 shows a schematic construction for setting out an overheating reference integration value for a generator using the pryolytic furnace.

FIG. 5 is a block diagram showing a turbo-generator to which a pyrolytic furnace and a detector are mounted. This turbo-generator 11 is of the hydrogen-cooled type, designed for an output power of $56 \times 10^4$ KVA, hydrogen charged pressure of 4.2 kg/cm$^2$ G, hydrogen circulating speed of 20 m/s, and an occupied space volume of 85 m$^3$. The hydrogen, flows in the direction indicated with arrow A, after absorbing heat produced by the generator to be cooled by heat regenerator 46, and returns inside the generator by an axial fan 41 attached to the generator's shaft. This cooling gas is partly extracted by bleed pipe 23 disposed at the inlet or the high pressure side 42 of heat regenerator 46 and is then fed back to the outlet or the low pressure side of heat regenerator 46 through return pipe 48 via detector 14. Bypass 32 is provided between the detector 14 and the return pipe 48 as shown in FIG. 5 to selectively connect the pyrolytic furnace 4 through the bypass. The pyrolytic furnace 4 is connected only when determining a reference value for integration of the concentration signal, and the valve 34 is closed while valves 36 and 38 are opened to allow extracted cooling gas to pass through the furnace. The bleed gas normally passes through pipe 30 with valves 36 and 38 being closed and valve 34 being opened.

The detector 14 actually uses, as aforementioned, an ion chamber particle detector of the type shown in U.S. Pat. No. 3,427,880. When substantially no submicron particle is contained in the cooling gas flow inside the detector, the hydrogen molecules in the cooling gas are ionized and the electric current carried by the ionized molecules will be detected by the electrode (not shown) installed in the detector. When submicron particles decomposed from the insulating material exist in the cooling gas, the ionized molecules attached to submicron particles by electric attraction and are not biased toward the electrode, thereby the electrode current being reduced. Letting the electrode current with the absence of submicron particles be a full scale value or 100%, the decrement of the electrode current relative to the full scale value represents the concentration of submicron particles.

Figure 7:
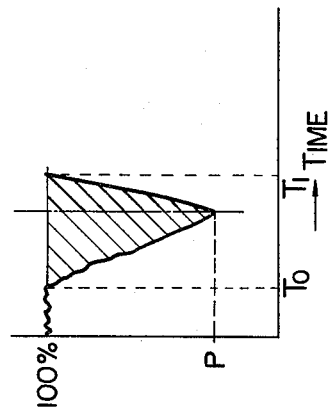
FIG. 7 illustrates a graphical representation of the concentration signal generated from the detector when heating a test piece in the pyrolytic furnace.

While circulating the extracted cooling gas through the pyrolytic furnace to bypass 32, the heating power source 8 of the pyrolytic furnace 4 is turned on to heat the test piece 5 with a constant heat quantity so as to cause thermal-decomposition of the insulating material 3 coated on test piece 5 thereby producing submicron particles, which are lead to the inside of generator 11 through the pipes to be diffused and diluted into the cooling gas, a part of which is extracted from bleed pipe 23. The concentration of the submicron particles contained in the extracted cooling gas will be detected by the detector 14, and thus the concentration signal will be obtained. Thus, the state which would have been seen upon occurrence of thermal-decomposition of the insulating material of the generator 11 is simulated by thermal-decomposition of the test piece 5. FIG. 7 shows the variation of the concentration signal detected by the detector 14 with a lapse of time, wherein the initial value of the concentration signal coincides with the full scale of 100% when no thermal-decomposition occurs in the test piece, but once the thermal-decomposition occurs the magnitude of the concentration signal decreases towards the minimum value P and then the magnitude of the signal upturns and rises as high as nearly 100%. Since, as explained before, the quantity of the insulating material coated on the test piece is corresponding to that of 200 cm$^2$, for example, of the insulating material actually coated on the generator, the magnitude of the concentration signal again increases after reaching the minimum value P, which indicates that the insulating material is almost wholly decomposed and then the production of submicron particles is rapidly reduced. When the whole quantity of insulating material coated on the test piece has been decomposed, the concentration signal returns to the full scale of 100%.

Several types of test pieces 5 different in coating area of insulating material 3 are used to measure an integration of the respective concentration signals and obtain diagrams showing the relationship between the integration of concentration signal and the thermal-decomposition area of the insulating material, as shown in FIG. 2. The relationship is different depending on the type of rotary machine, because the space for circulating the cooling gas is different depending on the type of machine. Therefore the diagram needs to be prepared for each type of the machine. If it should be judged that the generator is at an abnormal condition due to overheating when the insulating material is subjected to thermal-decomposition over an area of 200 cm$^2$, the integration of the concentration signal should be monitored with reference to 6000 V. sec for a machine represented by curve B, and 7000 V. sec for a machine represented by curve A. The reference value for each machine is obtained by integrating the concentration signal as shown in FIG. 7 from $T_0$ when the concentration signal begins to decrease to $T_1$ when the signal returns to the full scale while using a test piece corresponding to the machine.

Figure 6:
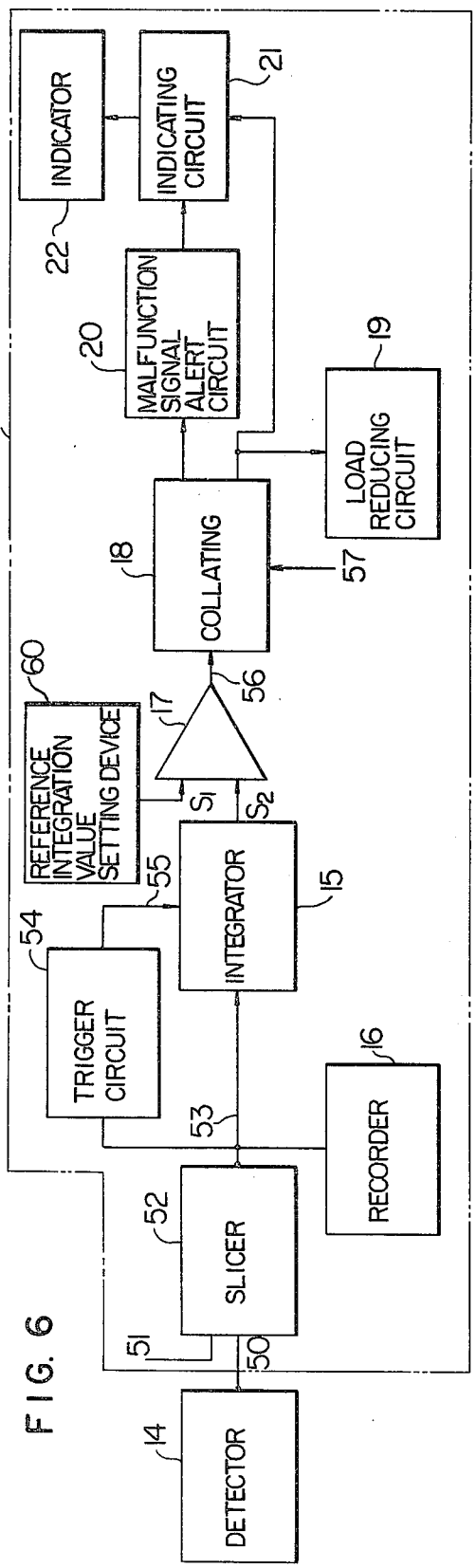
FIG. 6 shows a block diagram of the circuit for processing output signals from the detector.

In monitoring the overheating of generator, the output signal from the detector is given to a monitoring circuit 40 where an integration circuit is provided for integrating the signal outputted from the detector, and the integral value thus obtained is compared with a predetermined overheating reference integral value obtained in the abovementioned manner, and if the former exceeds the latter, the monitoring system acts to produce an alarm to indicate the occurrence of an abnormal condition due to overheating, and/or to reduce the generator load. Such a monitoring circuit will be explained hereinafter with reference to FIG. 6.

As aforementioned, the detector 14 outputs a signal 50 representing the concentration of submicron particles generated by thermal-decomposition of insulating material and contained in the cooling gas which is corresponding to the decrement of the signal value relative to the full scale as shown in FIG. 1, and the concentration signal 50 is given to slicer 52 which is used to remove noise from the concentration signal and produce an output signal 53 that is a part of the signal 50 exceeding a predetermined noise level 51. The signal 53 is given to an integrator 15. The output signal 53 is also given to a trigger circuit 54, which is composed of the Schmidt trigger circuit or the like, and generates a trigger signal 55 when the output signal 53 exists. The integrator 15 is operable while receiving the trigger signal 55, and it integrates the signal 53. When the trigger signal 55 disappears, the integrator 15 stops its operation and clears the content. In other words, the integrator integrates the output signal 53 so long as it is sent continuously from slicer 52, but when the slicer 52 stops the signal 53, the integrator halts the integral operation and clears the content, and when the slicer 52 resumes generating another input signal 53 the integrator restarts integrating the signal from zero. The noise level 51 is predetermined in accordance with noise characteristics of the detector 14. A part of the output signal 50 of detector 14 exceeding the noise level 51 or the output 53 of slicer 52 represents the concentration of particles. Further, the output 53 of slicer 52 is recorded in a recorder 16.

The output value $S_2$ of the integrator 15 is given to one of two inputs of a comparator 17, and it is compared with an overheating reference value $S_1$ applied to the other input of the comparator 17. The reference value $S_1$ is set out by the reference integration value setting device 60, and when the output value $S_2$ exceeds the reference value $S_1$, the comparator 17 generates an overheat alarm signal 56 and gives it to a collating circuit 18. The collating circuit 18 receives in such a manner as will be described hereinafter, an identification signal 57 which takes either binary "1" or "0" depending on whether the operation of the detector is normal or abnormal when the overheat alarm signal 56 is generated. When the signal 57 takes "1" the alarm signal 56 is inputted to the load reducing circuit 19 to decrease the load of the generator and at the same time the alarm signal is applied to an indicating circuit 21 to indicate the presence of abnormal local overheating and the start of load reducing on an indicator 22. On the other hand, when the signal 57 takes binary "0" the alarm signal 56 is inputted to a malfunction signal alert circuit 20 to indicate the occurrence of malfunction on the indicator 22 through the indicating circuit 21.

The overheating reference value to be set in the reference integral value setting circuit 60 is determined, as aforementioned, by using a test piece and pyrolytic furnace and can be manually adjusted. When the alarm signal 56 is generated by the comparator 17, the detector 14 is immediately tested automatically or manually as to whether it operates normally or malfunctions by applying a fixed amount of reference material to said detector to analyze the output condition of the detector. The identification signal 57 then gives binary "1" or "0" to the collating circuit 18 in accordance with the result of test.

As described above, since the present invention diagnoses local overheating on the basis of a signal representing the area of insulating material subjected to thermal-decomposition a highly reliable diagnostic result can be achieved regardless of the developing pattern of local overheating.

Having described the above embodiment of a hydrogen gas cooled generator, it is to be understood that the invention is not limited to the specific embodiment thereof, but rather can be applied broadly to any gas cooled rotary electric machine employing an insulating material coating which will generate submicron particles when the insulating material is exposed under high temperature heating.

We claim:

1. A method for diagnosing a local overheating state occurring in a gas cooled rotary electric machine using an insulating coating material which is subjected to thermal-decomposition when the coating material is exposed to high temperatures thereby generating submicron particles, said method comprising the steps of detecting the concentration in the cooling gas of submicron particles generated through thermal-decomposition of said insulating coating material, integrating a signal representing the concentration of said submicron particles with respect to time, and producing an alarm signal when said time-integration value exceeds a predetermined reference integration value which is variable depending on the circulating volume of the cooling gas for a rotary electric machine to be diagnosed.

2. The method according to claim 1 in which said time-integration is started when said signal representing the concentration of submicron particles exceeds a predetermined noise level.

3. The method according to claim 1 in which said reference integration value is determined by integrating a signal representing the concentration in the cooling gas of submicron particles which are artificially generated by thermal-decomposition of an insulating test piece made so as to simulate a predetermined area of the insulating coating material for said rotary electric machine and then introduced into the cooling gas circulating through said rotary electric machine.

4. An apparatus for diagnosing a local overheating state occurring in a gas cooled rotary electric machine using insulating coating material which is subjected to thermal-decomposition when said insulating coating material is exposed to high temperatures thereby generating submicron particles, said apparatus comprising: detecting means for detecting the concentration of submicron particles generated through thermal-decomposition of said insulating coating material and contained in the circulating cooling gas for said rotary electric machine, integrating means operable to integrate an output of said detector, means for activating said integrator when the output of said detector exceeds a predetermined noise level, alarm means for generating an alarm signal when the integration of said integrating means exceeds a predetermined reference integration value, and means for heating an insulating test piece simulating a predetermined area of the insulating coating material of said rotary electric machine thereby to generate artificial submicron particles derived from thermal-decomposition of said test piece and for selectively introducing said artificial submicron particles into the circulation of the cooling gas to be detected by said detecting means and integrated by said integrating means, so that the outputs of said integrating means are used to determined said reference integration value.

5. The apparatus according to claim 4 in which said alarm signal generating means comprises means for setting adjustably said reference integration value, and a comparator for comparing the output of said integrating means with the output of said setting means.

6. The apparatus according to claim 4 in which said detecting means is connected into an extracting pipeway provided for extracting a part of said cooling gas from upstream in circulation of the cooling gas in said rotary electric machine and feeding the extracted gas back to downstream of the circulation.

* * * * *